United States Patent [19]

Kleindiek

[11] Patent Number: 5,568,004

[45] Date of Patent: Oct. 22, 1996

[54] ELECTROMECHANICAL POSITIONING DEVICE

[76] Inventor: Stephan Kleindiek, Melanchthonstrasse 31, D-72074 Tübingen, Germany

[21] Appl. No.: 211,897

[22] PCT Filed: Sep. 7, 1993

[86] PCT No.: PCT/EP93/02414

§ 371 Date: Apr. 19, 1994

§ 102(e) Date: Apr. 19, 1994

[87] PCT Pub. No.: WO94/06160

PCT Pub. Date: Mar. 17, 1994

[30] Foreign Application Priority Data

Sep. 7, 1992 [EP] European Pat. Off. .............. 92202696

[51] Int. Cl.⁶ .................................................. H01L 41/09
[52] U.S. Cl. ......................... 310/328; 310/316; 310/369
[58] Field of Search .................................... 310/323, 328, 310/316, 317, 369

[56] References Cited

U.S. PATENT DOCUMENTS

| | | | |
|---|---|---|---|
| 3,287,579 | 11/1966 | Borner et al. | 310/328 |
| 3,864,572 | 2/1975 | van der Mast et al. | 250/306 |
| 4,523,120 | 6/1985 | Assard et al. | 310/323 |
| 4,772,817 | 9/1988 | Aida et al. | 310/328 |
| 4,785,177 | 11/1988 | Besocke | 310/330 |
| 4,871,938 | 10/1989 | Elings et al. | 310/328 |
| 5,198,715 | 3/1993 | Elings et al. | 310/328 |
| 5,325,010 | 6/1994 | Besocke et al. | 310/317 |

FOREIGN PATENT DOCUMENTS

| | | | |
|---|---|---|---|
| 0491435A2 | 6/1992 | European Pat. Off. | G01J 3/453 |
| 3610540C2 | 10/1987 | Germany | B25J 7/00 |
| 3822504C2 | 4/1990 | Germany | B25J 7/00 |

OTHER PUBLICATIONS

N. Agrait, "Vertical Inertial Piezoelectric Translation Device for a Scanning Tunneling Microscope," *Rev. Sci. Instrum.* 63(1), Jan. 1992, pp. 263–264.

K. Besake, "An Easily Operable Scanning Tunneling Microscope," Surface Science, 181, 1987, pp. 145–153.

G. Binnig et al., "Tunneling Through a Controllable Vacuum Gap," *Appl. Phys. Lett.* 40(2), 15 Jan. 1982, pp. 178–180.

*Primary Examiner*—Thomas M. Dougherty
*Attorney, Agent, or Firm*—Shefte, Pinckney & Sawyer

[57] ABSTRACT

An electromechanical positioning device to be used for positioning, for example, a probe-tip (12) in a scanning tunneling microscope, an electron emitter in a field electron gun, a mirror in an interferometer etc. comprises a low-mass support (10) as a moving drive means. The support, which is mounted to be frictionally movable in an electromechanical movement activating means, can be moved comparatively fast owing to its low mass and very precisely because its response to the movement force is controlled by sawtooth control pulses, preferably via a piezo-mechanical structure.

12 Claims, 4 Drawing Sheets

ELECTROMECHANICAL POSITIONING DEVICE

The invention relates to an electromechanical positioning device for exactly placing a tip means, particularly the tip of a needle-like probe, into a space of atomic order at the surface of a sample, said device comprising a piezo-tube having electrodes to be connected to variable voltages for the generation of movement actions of said tip means.

A positioning device of this kind, constructed as a piezo-mechanical device for positioning a tip means in a scanning tunneling microscope, is known from Review Sci. Inst. 63(1), January 1992, pp. 263–264. In the device disclosed therein a support carrying a sample to be investigated is frictionally mounted in a piezo-tube. Drawbacks of these devices are a comparatively complex construction, a comparatively high weight, their bulkiness, and the use of two different methods of movement for coarse and for fine positioning.

A further moving device for positioning a sample to be analysed in the range of atomic order, particularly in a scanning tunneling microscope (STM), is disclosed in DE 36 10 540 A1. According to this prior art the sample is placed on three piezo-holders having electrodes to be connected to variable voltages for the generation of positioning actions of said tip means. The distance between tip and sample can only be varied fine, that means in the range of the piezo-expansions. Coarse positioning actions with this moving device are only possible laterally, say transverse to the movement of the sample relative to the tip means.

A still further electromechanical positioning device, say micromanipulator, is disclosed in DE 38 22 504 A1. The micromanipulator comprises piezo-holders for carrying and moving the respective sample. For micromovements the holders are piezo-electficaily adjustable. For respective macromovements at least one of the holders comprise a socket, which is piezo-electrically deformable, whereby in the socket a bolt is mounted to be frictionally movable in said piezo-holder responsive to variable voltages to be applied to the holder. Thus the sample can be placed coarsely into a starting position for the required fine placing in relation to the tip of a needle-like probe or the like.

It is an object of the invention to mitigate the drawbacks of the known electromechanical positioning devices. It is a further object to design the device so that no movements of the sample are required to position—say bring closer to or move away from, respectively—the tip means or the like into the space of atomic order at the surface of the sample. The new device shall be constructed so that practically no mechanical vibrations, no thermal drifts can happen and no respective damping systems are required.

The solution according to the invention is characterized in that said tip means is connected to a low-mass support means, said support means is mounted to be frictionally movable in a direction vertical to the surface of the sample in said piezo-tube, and said piezo-tube comprises means for generating and transmitting electrically controllable movement actions to said support means in response to said variable voltages. Improvements and further developements of the invention are stated in the sub-claims.

Since the device in accordance with the invention comprises a single electro-mechanical drive for coarse as well as for fine positioning of the probe, the device can be comparatively small and of low weight, and is electrically controllable in a simple manner in that coarse and fine positioning can be realised automatically in a single action using only different control signals.

In a preferred embodiment the low-mass support is mounted in a friction holder under such a friction that, owing to its mass, it does not follow comparatively rapid longitudinal movements of the friction holder but it does follow comparatively slow movements of said holder. Such an embodiment enables coarse positioning of the moving-tip relative to the sample, preferably with a stepwise movement of the moving-tip owing to the comparatively slow movement of the holder and intermittent fast movements thereof. Preferably, a friction surface forms part of an intermediate element connected to a free end of a cylindrical part of the holder. Still more preferably the flexible low-mass support has a bended shape with only a few points of contact to the holder so that the friction can be adjusted.

According to the invention not the relatively heavy sample but the low-mass support means comprising the tip means, say a moving-tip, particularly the tip of a needle-like probe, is moved for a coarse as well as for a fine adjustment in the direction vertically to the surface of the sample to be investigated. Furthermore, not a rigid bolt for raising or lowering the heavy sample but a light wire or the like, itself only, is to be lifted or lowered according to the invention.

To be frictionally movable in said piezo-holder or in a friction holder position inside said piezo-holder the low-mass support means or the friction holder (at its inner surface) or both may comprise intermediate elements (e.g. pinched portions). Even more preferred, the support means may have an elastically bended shape, so that it frictionally contacts the inside of the respective holder at least at three contact areas. In the first case the intermediate elements particularly are comprised of three knobs, one in the middle and one at each end of said support means (within the friction holder) or the inner surface of the respective holder, and projecting alternately at the one and at the other side of the support means or at both sides each. In the more preferred case the low,-mass support means is also comprised of a longitudinal member, particularly an elastic needle-like wire but in this case the support means has an elastically bended shape so that it frictionally contacts the inside of the respective holder at least at three contact areas. The respective frictional strength—say the intensity of frictional force—particularly in the latter case is adjustable by altering the grade of elastic bending.

The friction holder, particularly its inside surface, is preferably made of glass or a ceramic material. If necessary the tip means can be electrically contacted via the low-mass support means by a thin cable at the lower end of said support means. Also preferably the friction holder (or its inside surface) is made of a metal. To produce the desired frictional force the metal, preferably a metal coating, shows a specially prepared surface-roughness inside too. In this case the tip means can be electrically contacted (if necessary) via the low-mass support means and said metal-friction holder. The cable is then fixed at the lower end of the metal-friction holder and the low-mass support means comprising the tip means can easily be replaced, because it is not fixed anywhere.

One advantage of the piezo-tube of the invention is that this tube can enclose or surround a friction holder which is particularly tube-like too. In said friction holder the low-mass support means can be mounted under friction, whereby the term "low-mass" is defined by the ratio between said friction and the weight of said low-mass so that the support means does not follow comparatively rapid movements of said friction holder but follows comparatively slow movements of said holder.

Another advantage of the electromechanical positioning device of the invention is that said piezo-tube can be coaxially surrounded by a further piezo-tube for scanning the (relatively heavy) sample laterally—say transverse to the movement actions of said support means—relative to the tip means. In principle the outer piezo-tube can be formed by three or more piezo-holders but it is preferred to use a tube-like holder which consists essentially of one piece of material, so that an outer coaxial tube can thermally and mechanically protect the positioning device placed inside. This design reduces the size of the whole device strongly, so that it is nearly insensitive against mechanical vibrations. The length of inner and outer piezo-tube should be at least substantially the same and both can be mounted on a common support. In that sense no thermal expansion problems will occur as long as the entire device is at the same temperature, which is easy to achieve, especially because there are only electrical connections. In this setup the sample can be easily put on said outer piezo-tube without any complicated preparation. This can even be done automatically.

In order to achieve purely electrically controlled positioning, a preferred embodiment comprises a piezo-tube having an inner and an outer control electrode in order to realise said longitudinal movement or adjustment of the low-mass support. Preferably, a friction surface forms part of an element of a non-piezo-active material connected to a free end of the positioning piezo-tube. In such an embodiment one-directional movement or adjustment of the moving-tip can be obtained easily by electrical activation of the piezo-tube. For this purpose, in a preferred embodiment, the control electrodes are connected to a sawtooth generator. The support means can follow the gradual slopes of the sawtooth pulses but is not capable of following the steep slopes. Thus, all the longitudinal positioning movements result in the tip-sample spacing being adjusted by merely moving the extremely light-weight support means. No further mass must be moved.

A further embodiment comprises control means for controlling the sawtooth pulses in response to a predetermined current between said tip means and the respective sample, preferably said current is subsequently stabilised by the means of a control loop. Such a control means enables the tip means to be positioned automatically without a break whereby the activation of the piezo-tube is interrupted at a given distance (tip-means/sample) and subsequently fine positioning, starting at the position then reached, is effected by adapted activation of the same piezo-tube, preferably with a signal derived from the tip means position.

Change-over from a first positioning range to a further one preferably is effected by a sawtooth-pulse control signal generated as a function of a predetermined moving-tip-to-sample spacing. From a situation thus reached a further positioning range is available, for example during scanning in a scanning tunneling electron microscope.

A piezo-mechanical device in accordance with the invention is very useful for all kinds of probe-scanning microscopes such as a scanning tunneling microscope, an atomic force microscope, a magnetic force microscope etc. The device is also very suitable for a field electron gun, in which the tip means functions as the electron-emitting element, and for exactly positioning an optical element such as a mirror in an optical apparatus, particularly in an interferometer.

Some embodiments of the invention will be described in more detail hereinafter with reference to the accompanying drawings. In the drawings FIG. 1a and 1b shows diagrammatically a piezo-mechanical device in accordance with the invention;

Figure 1A:
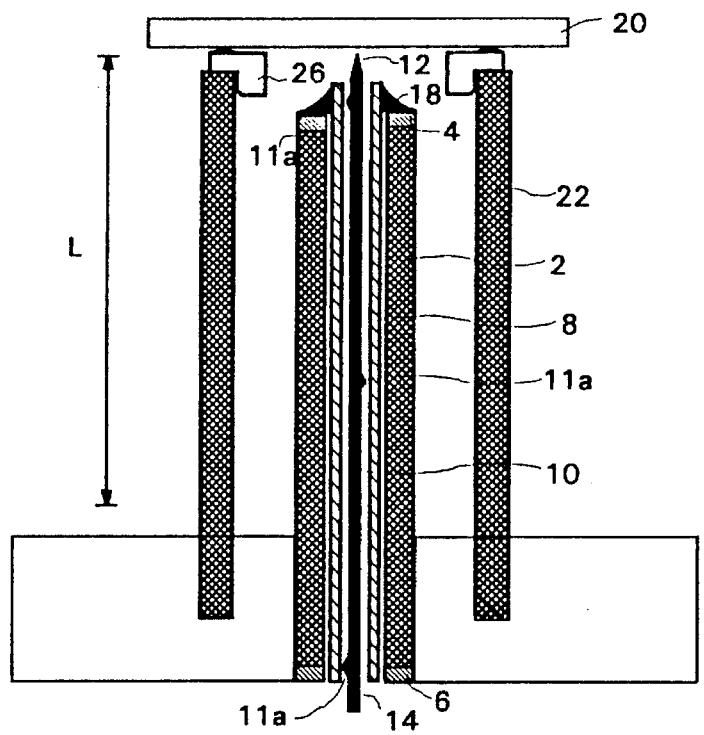
Figure 1B:
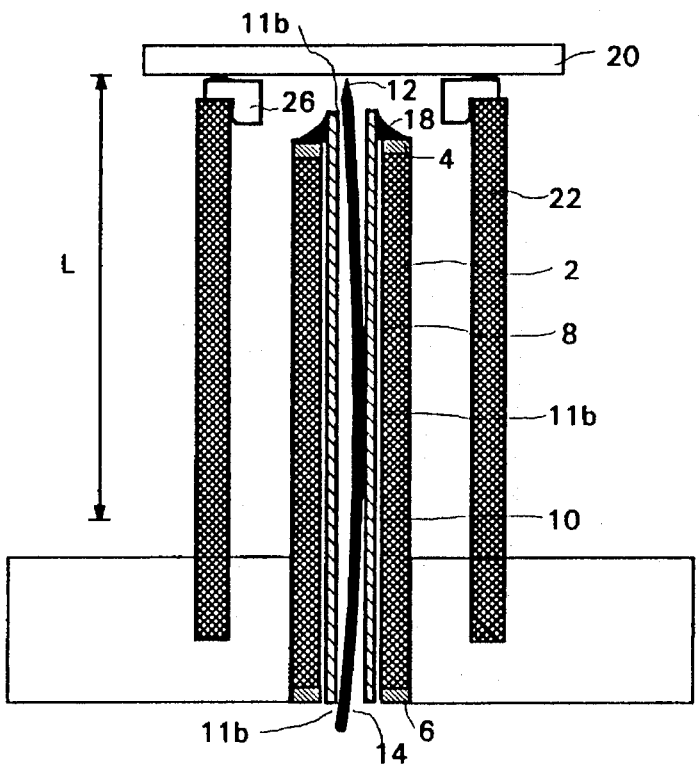

A device in accordance with the invention as shown in FIGS. 1a and 1b comprises a piezo-tube 2 having two control electrodes 4 and 6. The piezo-tube 2 includes a non-piezo mounting tube 8, which tube functions as a friction holder for a needle- or wire-shaped support (means) 10 supporting a tip means, particularly moving-tip 12. The end 14 of the support 10 opposite to the moving-tip 12 projects freely from the friction holder 8. The support 10 is made of low-mass wire and is mounted in the friction holder 8 under a given friction. The definition of the magnitude of this friction in relation to the low mass of the wire is mentioned above.

To obtain the desired friction in a first embodiment the support 10, the friction holder 8 or both may be provided with pinched portions 11a. FIG. 1a shows these intermediate elements or pinched portions 11a in the form of three knobs positioned in the middle and one at each end of the support 10 within the mounting or friction holder 8. They are projecting alternately to one or the other side of this support 10 or to both sides of which.

In a further embodiment the low-mass support 10 or wire has a bended shape with only a few points or areas of contact to the inside of the friction holder 8, particularly three contact sites or areas 11b as shown in FIG. 1b. Particularly in this embodiment the degree or intensity of friction between support 10 and friction holder 8 can be adjusted by bending the wire or support 10 appropriately. The wire-shaped support 10 preferably should have a diameter of about 0.25 mm and may be made of Pt-Ir, which is a preferred material for a tip means in a scanning tunneling microscope. The height L of the wire can vary, for example, between about 4 and 10 mm dependent on different applications. For the purpose of positioning the moving-tip the friction holder 8 can be fixed to the piezo-tube 2 by for example a bonding glue 18 which glue should be rigid and should have a low mass to allow rapid movements.

Figure 2:
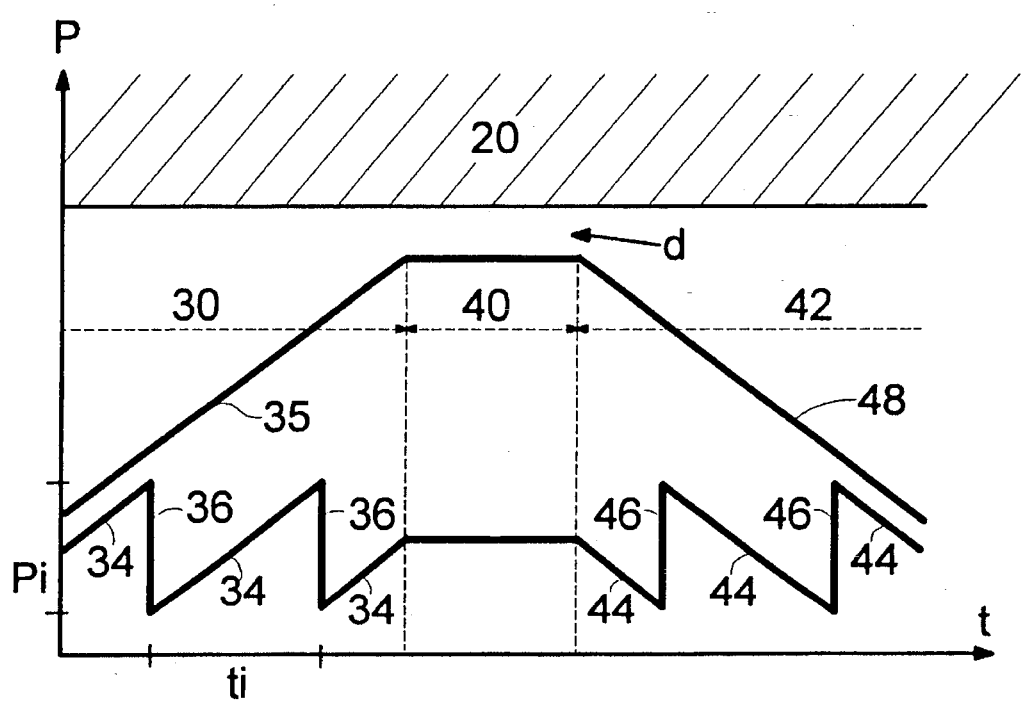
FIG. 2 shows some control signals and the resulting movements in the device.

Mounted with the correct friction the wire-shaped support 10 will follow piezo movements—because of its low mass - if the acceleration does not exceed, for example, $10^3$ m/s$^2$ resulting from a friction-force/support-mass ratio of approximately 15 mN/15 mg. In order to move the moving-tip towards a sample 20 a sawtooth voltage according to FIG. 2 is applied to the electrodes of the piezo-tube. During the fast contraction, or fast expansion, of the piezo-tube 2 and thus of the friction holder 8, for example with an acceleration of about $10^4$ m/s$^2$, the supporting wire 10 remains in position owing to its inertia. It is obvious that the force of gravity of 10 m/s$^2$ has no substantial influence on the operation.

During the slow expansion or contraction brought about by the slow slope of the control sawtooth the support is moved so that the tip means can be brought approximately to a given spacing from the sample. Thus, coarse positioning is effected, the sawtooth control signal merely being inverted to increase or decrease the spacing. A given tunneling current from the tip means can be used as the control criterion to approach to an operational position. From that point the desired fine positioning of a tip means can be effected by any method known per se using a standard feedback control as described with reference to FIG. 3. The sample 20 is preferably supported by a second piezo-tube 22 mounted—particularly coaxially and / or at a proper distance around the piezo-tube 2—on a base plate 24 which also carries the first piezo-tube 2. The base plate 24 is preferably made of a material having thermo-mechanical properties similar to those of the piezo-material. Thus, all thermal influences on the spacing between moving tip 12 and sample 20 are avoided as long as the entire device is at the same temperature. The second piezo-tube 22 is preferably provided with the well known quadrant control electrodes, enabling X–Y scanning of the sample relative to the tip means, as is known from Surface Sci. 181, 1987, pages 145–153. At the second piezo-tube 22 a supporting ring 26 may be fixed for well defining the position of the sample.

For the sake of clarity FIG. 2 shows the movements of the tip means obtained by means of the sawtooth control signal, the tip movement being given as a function of time t in a comparative fashion because a zero value is not relevant here. For example a traject Pi indicates 100 nm and a traject ti indicates 10 msec. In a time interval 30 gradual slopes of a sawtooth control pulse introduce comparatively slow friction holder movements 34 whilst steep slopes of the sawtooth pulse introduce fast movements 36 of the friction holder. The low-mass support 10 only follows the first-mentioned movements, as a result of which the moving-tip is moved to the sample 20 along a line 35, whilst the support 10 and hence the moving-tip remain stationary during the fast movements 36. This proceeds until a given spacing d is reached. At that instant the sawtooth signal is interrupted automatically by the aid of a moving-tip-correlated signal, for example a tunnel-current signal provided by a probe-tip. During a time interval 40 the position of the moving-tip is stabilised. The distance d is thus stabilised, for example during scanning of the sample, by the aid of a known feedback control loop. Such a control loop can easily handle a relatively large variation occurring during scanning and also allows a rapid change-over to a further scanning field.

When sample examination has been completed the tip means is removed from the sample in a time interval 42, in which an inverted sawtooth control signal of which slowly falling slopes introduce movements 44 which are followed by the low-mass support 10 and steep rising slopes which give rise to fast movements 46 which are not followed by the support 10. This results in the support 10 being forced to move away from the sample 20 along a line 48 until a safe distance for parking, for example as required for sample changing, is reached.

Figure 3:
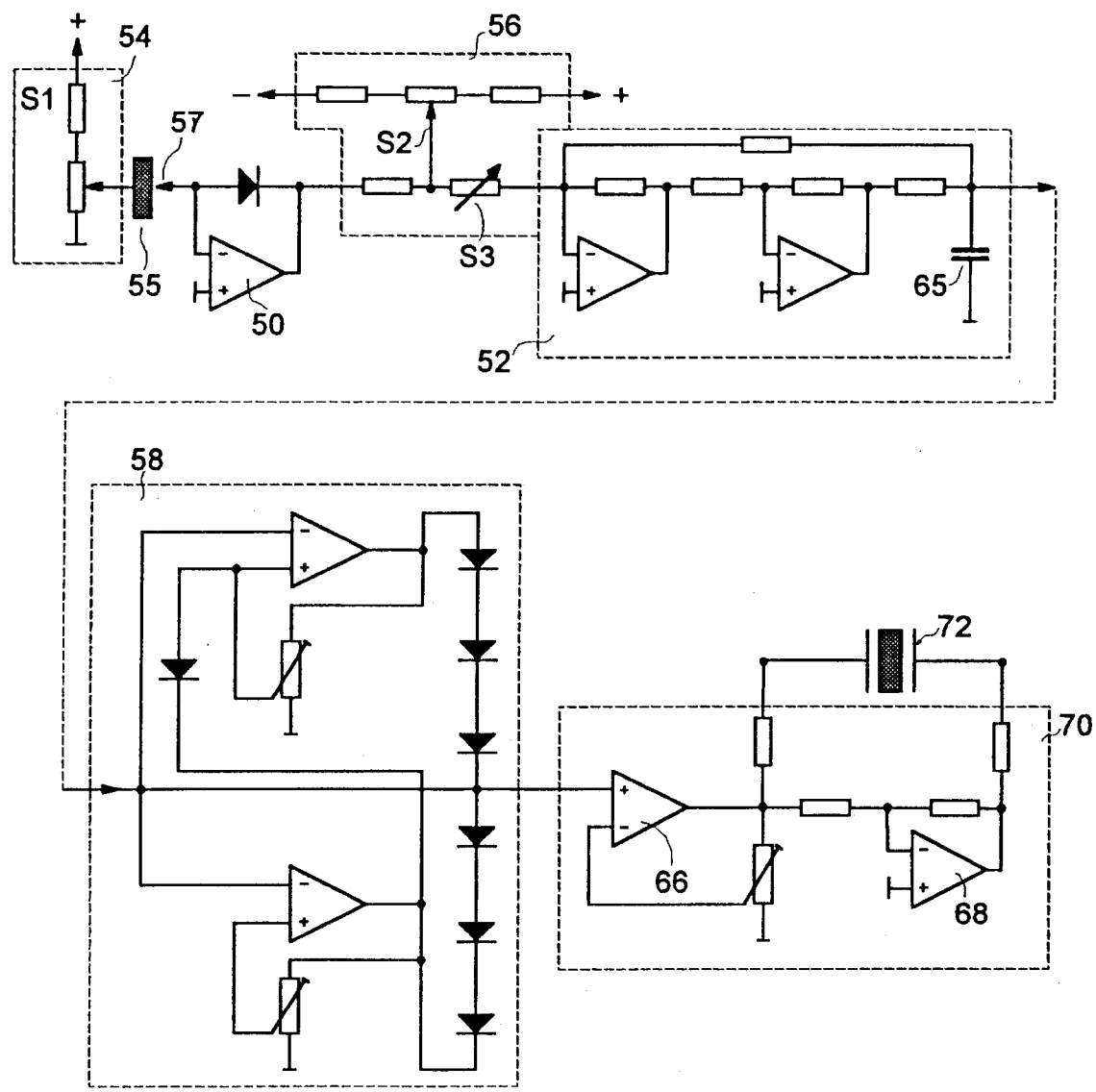
FIG. 3 shows an electronic circuit for generating the control signals.

FIG. 3 shows a control circuit for coarse and fine positioning of a moving-tip. A feedback loop comprises a logarithmic amplifier 50, an integrator 52 with a feeding control 54 and a tunneling current control 56 for adjusting a tunneling current between a sample 55 and a tip means 57. The feedback control is followed by two Schmitt trigger circuits 58. A follower 66 and an inverter 68, double the control range for the piezo structure 72. A power supply of, for example, 18 V can be used to avoid problems with high voltage supplies. In the circuit: S1 sets a tunnel voltage, S2 adjusts the tunnel current, which has a positive value for tip means approach and a negative value for tip means removal, and S3 defines the loop bandwidth and the approach velocity of the tip. S1, S2, S3 can be replaced by voltage controlled resistors or the like for automatical operation.

Figure 4:
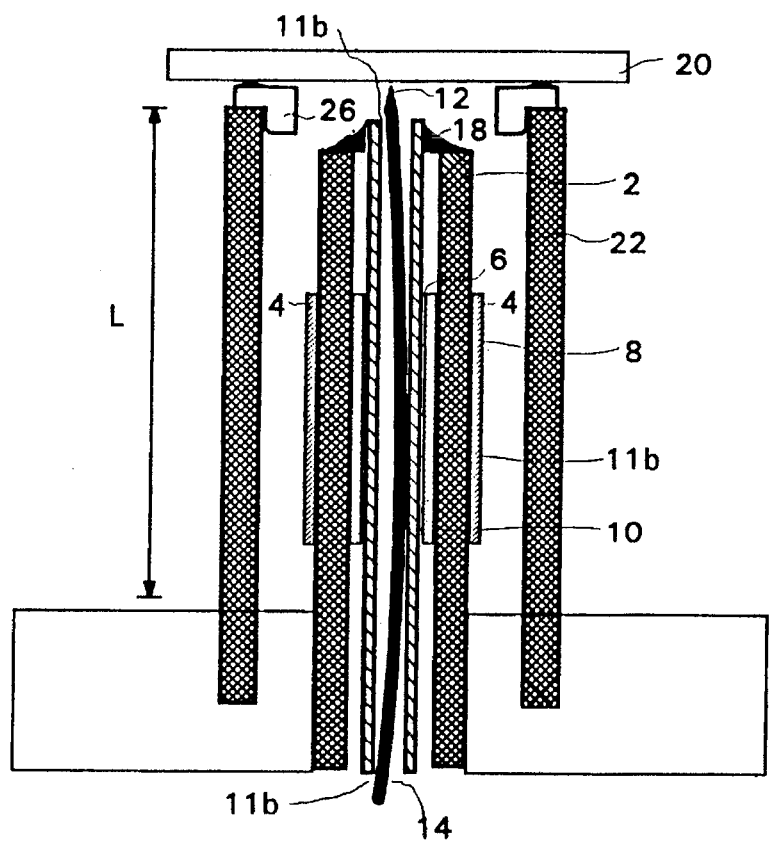
FIG. 4 shows diagrammatically an alternative embodiment of a piezo-mechanical device in accordance with the invention.

As shown in FIG. 4, in an alternative embodiment the control electrodes 4 and 6 each have a from of a cylindrical tube and are positioned at the outer wall and the inner wall, respectively, of the piezo-tube 2. Expansion or contraction of the piezo-tube 2 is achieved in that a voltage is applied to control electrodes 4 and 6 so that the wall of the piezo-tube 2 contracts or expands in a radial direction. Because of volume conservation, contraction or expansion in said radial direction induces expansion or contraction, respectively, along the longitudinal axis of the piezo-tube 2.

A device as shown in FIG. 1a or b can readily constitute the heart of a scanning tunneling microscope (STM) as described in Appl. Phys. Lett. 40 (1982), p. 178. The device can be placed in a dewar to obtain a fixed temperature or at least the same temperature for all the relevant elements, but this has proved not to be necessary here. The device is powered via comparatively thin wires for a better thermal control and to avoid vibration problems. If the resonant frequency of the device is approximately 10 kHz a damping over 150 dB can be reached at a frequency of 1 Hz, making the measurement set-up highly vibration free. The bandwidth of the feedback loop is limited only by the first-order longitudinal resonance of the inner piezo-tube structure and may reach approximately 100 kHz, allowing a scanning speed of up to 100,000 pixels per second or four 128×128 pixel frames per second.

An STM in accordance with the invention combines high mechanical and thermal stability with a high speed of operation and a very easy sample mounting. Neither the mechanical nor the electronic system requires the use of any high-precision parts. The STM positioner consists of no more than five parts: a baseplate, an X–Y scanner tube, a Z-piezo-tube, a friction holder and a low-mass support. Unlimited-range X–Y and Z coarse positioning is possible by applying sawtooth voltages to the piezo-tubes, utilizing the principle of friction and inertial sliding. The electronic system uses standard low-cost operational amplifiers, voltages above 20 V being avoided. The simple and compact construction of the STM with few electrical connections opens up many new applications such as low-temperature STM, ultrahigh vacuum STM, automatic sample measurement in test bays, etc.

A device in accordance with the invention is also very suitable for positioning an electron emitter in a field electron gun as disclosed in U.S. Pat. No. 3,864,572. Mounting as well as adjustment upon operational degradation of such an emitter can be effected easily by means of the positioning device. Control is possible by means of the desired electron current or a signal derived from this electron current.

A positioning device in accordance with the invention can also be used for positioning, for example, a mirror or any other optical element in a precision optical system such as an interferometer as disclosed in EP 491,435. Such a device without the scanning means as shown in FIG. 1 a and b can be mounted easily into such an optical system and can be used as well for the final adjustment, for wavelength control and for assembly.

According to the invention an electromechanical positioning device to be used for positioning, for example, a probe-tip (12) in a scanning tunneling microscope, an electron emitter in a field electron gun, a mirror in an interferometer etc. comprises a low-mass support (10) as a moving drive means. The support, which is mounted to be frictionally movable in an electromechanical movement activating means, can be moved comparatively fast owing to its low mass and very precisely because its response to the movement force is controlled by sawtooth control pulses, preferably via a piezo-mechanical structure.

I claim:

1. An electromechanical positioning device for exactly placing a tip means (12), including the tip of a probe which is capable of producing an output, into a space of atomic order at the surface of a sample (20), said device comprising a piezo-tube (2) having electrodes (4,6) connected to variable voltages for the generation of movement actions of said tip means, wherein said tip means (12) is connected to a low-mass support means (10), said support means is frictionally mounted inside said piezo-tube to be movable along a friction surface in a direction perpendicular to the surface of the sample, and said piezo-tube comprises means for generating and transmitting electrically controllable movement actions to said support means (10) in response to said variable voltages.

2. A positioning device according to claim 1, characterized in that said piezo-tube (2) surrounds a friction holder (8), which is tube-shaped too, and said low-mass support means (10) is mounted in frictional contact with, and longitudinally movable inside, said friction holder (8), whereby the ratio between said friction and the mass of said low-mass support member is such that the support means does not follow comparatively rapid movements of said friction holder but does follow comparatively slow movements of said holder (8).

3. A positioning device according to claim 1 characterized in that said friction surface forms part of said low-mass support means (10), or the inner surface of said friction holder (8), wherein said friction surface (11 a) is comprised of three knobs, one in the middle and one at each end of said support means (10) or said holder (8), and project alternately from alternate sides of the support means (10) or holder (8).

4. A positioning device according to claim 1 characterized in that said low-mass support means (10) is comprised of an elastic wire, having a bent shape so that it frictionally contacts the inside of the friction holder (8) at at least three contact areas (11b), the frictional strength being adjustable by altering the amount of bending.

5. A positioning device according to claim 1 characterized in that said piezo-tube (2) has electrodes (4,6) connected to a sawtooth generator producing a sawtooth pulse which in turn produces said movements, said low-mass support means (10) being responsive to slow movements and being not responsive to fast movements of the friction holder (8).

6. A positioning device according to claim 5, characterized in that means are provided to control the sawtooth pulse of said generator in response to the output of the tip means (12), said predetermined tip means output subsequently being stabilized by means of a control loop.

7. A positioning device according to claim 6, characterized in that changing over to a subsequent positioning range of the tip means (12) is effected by means of a sawtooth-pulse control signal generated in dependence of the tip-means-to-sample spacing.

8. A positioning device according to claim 1, characterized in that said piezo-tube (2)is surrounded, at a proper distance, by a further piezo-tube (22) for scanning the sample transverse to the movement direction of said support means.

9. A positioning device according to claim 3, characterized in that said friction holder (8) has an inside coating which is made of glass, a ceramic material or a metal, having a predetermined surface-roughness at the inside surface to produce the required frictional force.

10. A scanning tunneling electron microscope provided with a positioning device as claimed in claim 1, for coarse as well as fine positioning of a tip means relative to a sample to be examined.

11. A field electron source provided with a positioning device as claimed in claim 1, for positioning an electron emitter relative to a control electrode of the electron source.

12. An optical instrument wherein an optical element to be positioned with a high precision is provided with a positioning device as claimed in claim 1.

* * * * *